(12) United States Patent
Tempel et al.

(10) Patent No.: US 7,026,220 B1
(45) Date of Patent: Apr. 11, 2006

(54) METHOD FOR PRODUCTION OF CHARGE-TRAPPING MEMORY DEVICES

(75) Inventors: Georg Tempel, Dresden (DE); Elard Stein von Kamienski, Dresden (DE); Stephan Riedel, Dresden (DE); Veronika Polei, Dresden (DE); Roland Haberkern, Dresden (DE); Roman Knoefler, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/006,484

(22) Filed: Dec. 7, 2004

(51) Int. Cl.
*H01L 21/336* (2006.01)
*H01L 21/3205* (2006.01)

(52) U.S. Cl. .............. 438/287; 438/288; 438/591; 438/954

(58) Field of Classification Search .......... 438/287, 438/288, 591, 954
See application file for complete search history.

(56) References Cited

U.S. PATENT DOCUMENTS

| | | | |
|---|---|---|---|
| 5,168,334 A | 12/1992 | Mitchell et al. | |
| 5,768,192 A | 6/1998 | Eitan | |
| 5,966,603 A | 10/1999 | Eitan | |
| 6,011,725 A | 1/2000 | Eitan | |
| 6,482,706 B1 * | 11/2002 | Yeh et al. | 438/301 |
| 6,518,103 B1 * | 2/2003 | Lai | 438/150 |
| 6,627,500 B1 * | 9/2003 | Liu et al. | 438/261 |
| 2003/0100153 A1 | 5/2003 | Kunori | |
| 2003/0185071 A1 * | 10/2003 | Yoshino | 365/200 |
| 2004/0018686 A1 * | 1/2004 | Polei et al. | 438/262 |

* cited by examiner

*Primary Examiner*—Trung Dang
(74) *Attorney, Agent, or Firm*—Slater & Matsil, L.L.P.

(57) ABSTRACT

The method aims at improving the charge confinement of the memory layer at the edges facing the regions of buried bitlines. After the deposition of the memory layer between confinement layers and the implantation of dopants for bitlines and source/drain regions, an oxidation of semiconductor material to form upper bitline isolation regions takes place. By this method, additional oxide regions are produced at the edges of the memory layer in the same oxidation step. Either a silicon layer may be deposited and reduced to sidewall spacers, which are subsequently oxidized; or recesses are etched into the memory layer and subsequently filled with semiconductor oxide.

16 Claims, 2 Drawing Sheets

METHOD FOR PRODUCTION OF CHARGE-TRAPPING MEMORY DEVICES

TECHNICAL FIELD

The invention concerns a method for production of charge-trapping memory devices, especially of NROM or SONOS memory devices. These devices comprise a memory layer sequence of dielectric materials provided for the programming by the trapping of charge carriers.

BACKGROUND

Nonvolatile memory cells that are electrically programmable and erasable can be realized as charge-trapping memory cells, which comprise a memory layer sequence of dielectric materials with a memory layer between confinement layers of dielectric material having a larger energy band gap than the memory layer. The memory layer sequence is arranged between a channel region within a semiconductor body and a gate electrode provided to control the channel by means of an applied electric voltage. Examples of charge-trapping memory cells are the SONOS memory cells, in which each confinement layer is an oxide and the memory layer is a nitride of the semiconductor material, usually silicon (see U.S. Pat. No. 5,768,192 and U.S. Pat. No. 6,011,725, which are incorporated herein by reference).

Charge carriers moving from source to a drain through the channel region are accelerated and gain enough energy to be able to penetrate the lower confinement layer and to be trapped within the memory layer. The trapped charge carriers change the threshold voltage of the cell transistor structure. Different programming states can be read by applying the appropriate reading voltages.

Charge-trapping memory devices can be provided with buried bitlines, which electrically connect the source/drain regions of the memory cells. A memory layer sequence, typically an oxide-nitride-oxide layer sequence, is located above the channel regions between corresponding source/drain regions. Above the buried bitlines, a thick oxide is formed as an electrically insulating region, especially to separate the gate electrode sufficiently from the buried bitlines. The memory layer sequence is confined to the channel region and overlaps the source/drain regions only slightly.

In the course of the production of the insulating oxide, a bird's beak shape is produced at the lateral edges of the memory layer sequence. Here, the problem arises that the memory layer, typically the silicon nitride layer, is not sufficiently surrounded by the confinement layers in order to provide a reliable charge-trapping. Especially the application of higher temperatures and gate stress can lead to a charge loss in this region. This may lead to a drift of the read current of the memory cell. If electrons are used as charge carriers to be trapped in the memory layer, an injection of holes originating from the gate electrode into the nitride of the memory layer may occur, and the holes may diffuse towards the trapped electrons and thus effect a charge compensation canceling the programmed state.

This problem may be obviated by a deposition of an additional oxide layer to increase the thickness of the confinement layer at the edges of the memory layer sequence. As this oxide layer has to be deposited before the formation of the gate electrode stack, the production process grows considerably more complex, and the final thickness variations of the memory layer sequence are also increased by this method.

SUMMARY OF THE INVENTION

In one aspect, the present invention provides a method for production of charge-trapping memory devices comprising a memory layer sequence and buried bitlines which removes the problem of a charge loss at the edges of the memory layer sequence facing the buried bitlines.

A first variant of the method comprises the following process steps: a memory layer sequence comprising a bottom confinement layer, a memory layer, and a top confinement layer is deposited on a main surface of a semiconductor substrate; openings in the memory layer sequence are produced in locations of intended bitlines; a dopant is implanted to form buried bitlines and source/drain regions that are electrically connected by the bitlines; the memory layer is etched back selectively with respect to the confinement layers, starting from the openings, to form recesses in the memory layer; and an oxidation is performed to produce oxide regions above the bitlines and to fill the recesses with oxide.

A second variant of the method comprises the following process steps: a memory layer sequence comprising a bottom confinement layer, a memory layer, and a top confinement layer is deposited on a main surface of a semiconductor substrate; openings in the memory layer sequence are produced in locations of intended bitlines; a dopant is implanted to form buried bitlines and source/drain regions that are electrically connected by the bitlines; the memory layer is etched back selectively with respect to the confinement layers, starting from the openings, to form recesses in the memory layer; a semiconductor layer is deposited filling the recesses; a major portion of the semiconductor layer is removed, leaving at least remaining parts that fill the recesses; and an oxidation is performed to produce oxide regions above the bitlines and to convert the remaining parts of the semiconductor layer into oxide.

A third variant of the method comprises the following process steps: a memory layer sequence comprising a bottom confinement layer, a memory layer, and a top confinement layer is deposited on a main surface of a semiconductor substrate; openings in the memory layer sequence are produced in locations of intended bitlines, thereby forming sidewalls to the memory layer sequence; a dopant is implanted to form buried bitlines and source/drain regions that are electrically connected by the bitlines; a semiconductor layer is deposited; an anisotropic etching step is performed to reduce the semiconductor layer to sidewall spacers at the memory layer sequence; and an oxidation is performed to produce oxide regions above the bitlines and to convert the sidewall spacers into oxide.

These and other features and advantages of the invention will become apparent from the following brief description of the drawings, detailed description and appended claims and drawings.

BRIEF DESCRIPTION OF THE DRAWINGS

Preferred embodiments and examples of the method according to this invention will be further described in detail in connection with the appended drawings.

The following list of reference symbols can be used in conjunction with the figures

| |
|---|
| 1 substrate |
| 2 source/drain region |
| 3 bottom confinement layer |
| 4 memory layer |
| 5 top confinement layer |
| 6 opening |
| 7 recess |
| 8 bit oxide |
| 9 gate electrode |
| 10 semiconductor layer |
| 11 recess filling |
| 12 sidewall spacer |

DETAILED DESCRIPTION OF ILLUSTRATIVE EMBODIMENTS

Figure 1:
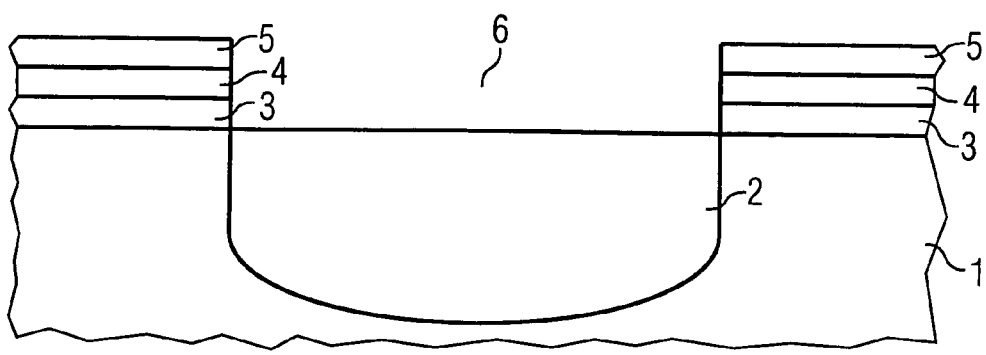
FIG. 1 shows a cross-section of an intermediate product of the inventive method after the implantation of the buried bitlines.

FIG. 1 shows a cross-section through an intermediate product of a charge-trapping memory cell according to a first embodiment of the inventive method. A semiconductor substrate 1 having a main surface is covered with a memory layer sequence comprising a bottom confinement layer 3, a memory layer 4, and a top confinement layer 5. This memory layer sequence can especially be an oxide-nitride-oxide layer sequence. The memory layer sequence is provided with openings 6 in the areas of the source/drain regions and buried bitlines. An implantation of a dopant is performed to produce the source/drain regions 2 and the buried bitlines, which form electric connections between the source/drain regions 2.

In the production method according to the prior art, electrically insulating regions are formed above the bitlines by an oxidation step, by which the semiconductor material of the substrate 1 is oxidized in the area of the openings 6. In the course of the oxidation, the volume of the semiconductor material increases so that the edges of the memory layer sequence are lifted upwards above the so-called bird's beaks formed by the marginal regions of the oxidized material. As this procedure leads to insufficient electric insulation of the memory layer 4 at the lateral edges, the production method is modified to improve the electric insulation at these locations. To this end, the edges of the memory layer 4 are preferably etched back to form recesses.

Figure 2:
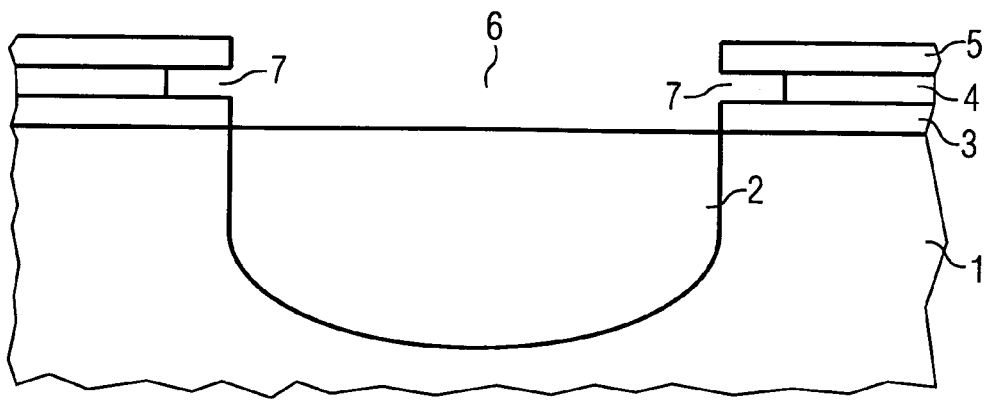
FIG. 2 shows the cross-section according to FIG. 1 after the etching of lateral recesses in the memory layer.

FIG. 2 shows the cross-section according to FIG. 1 after the etching of recesses 7, starting from the openings 6. The recesses 7 have preferably a lateral depth which is at least equal to the sum of the thicknesses of the bottom confinement layer 3 and the memory layer 4. These recesses can subsequently be filled with an oxide of the semiconductor material so that the confinement of the charge-trapping memory layer 4 is essentially improved.

Figure 3:
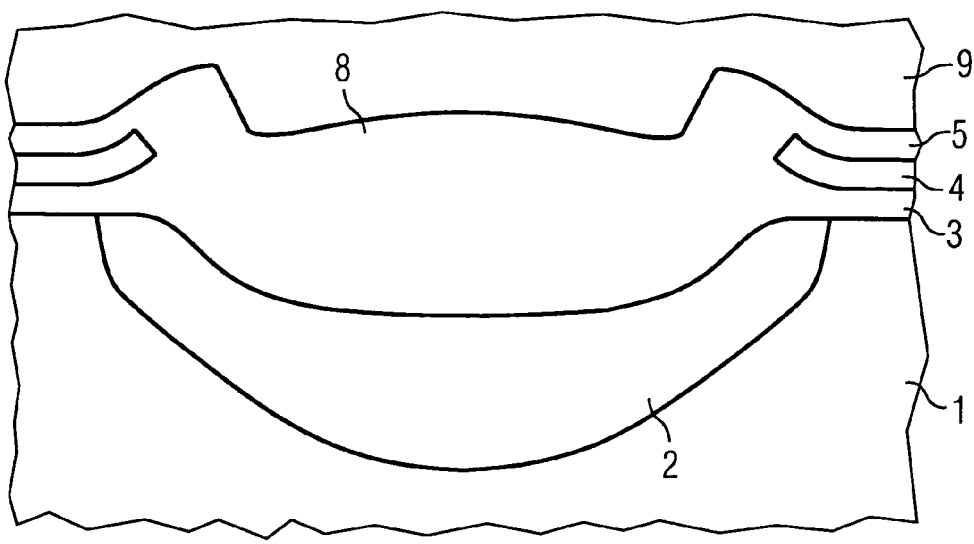
FIG. 3 shows the cross-section according to FIG. 2 after the formation of oxide filling the recesses and the application of a gate electrode.

FIG. 3 shows the cross-section according to FIG. 2 after the oxidation step, by which a bitline oxide 8 is formed above the source/drain regions 2 and the buried bitlines. The memory layer 4 is bent upwards above the lateral bird's beaks of the bitline oxide. The openings are filled with the material of gate electrodes 9, which are electrically connected by wordlines. FIG. 3 clearly shows the improved electric confinement at the lateral edges of the memory layer 4, achieved by the application of the recesses, which are filled with the bitline oxide.

This method is especially appropriate if the memory layer sequence is formed of oxide, nitride and oxide. In this case, the recesses 7 can be formed by a selective nitride pull-back, which does not remove the material of the oxide confinement layers. The top confinement oxide layer and the bitline oxide are merged in the course of the oxidation step. This first variant of the inventive method has the advantage to necessitate only one additional etching step, by which the recesses are formed, so that the process complexity is only slightly increased. This method shows that an essential improvement can be obtained by a slight modification of the process, which can be performed easily and economically.

A more sophisticated version of the inventive method makes use of the deposition of additional semiconductor material. Instead of a direct deposition of an electrically insulating oxide, a layer of semiconductor material is deposited and subsequently oxidized. A first variant of this kind of method also makes use of lateral recesses 7 in the memory layer 4. Starting from the intermediate product according to FIG. 2, a layer of semiconductor material is deposited.

Figure 4:
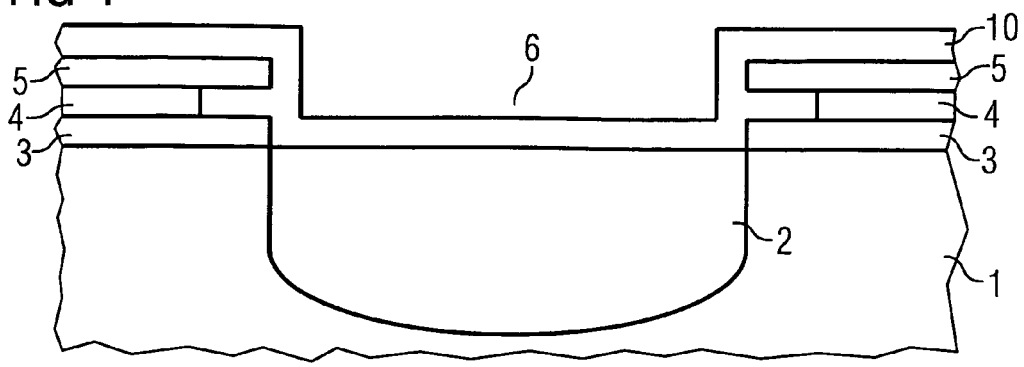
FIG. 4 shows a cross-section according to FIG. 2 for an alternative embodiment after the application of a semiconductor layer.

FIG. 4 shows the cross-section according to FIG. 2 after the deposition of the semiconductor layer 10, which also fills the recesses 7 between the top and bottom confinement layers 5, 3 at lateral edges of the memory layer 4. The semiconductor layer 10 is removed at least above the top confinement layer 5 and above the source/drain regions 2 and the buried bitlines. The semiconductor 10 can be, for example, polycrystalline or amorphous silicon.

Figure 5:
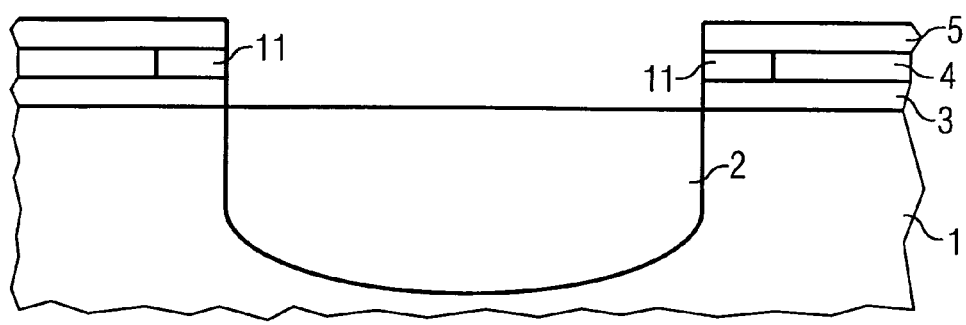
FIG. 5 shows the cross-section according to FIG. 4 after the removal of major parts of the deposited semiconductor layer.

FIG. 5 shows the cross-section according to FIG. 4 after the removal of the major-parts of the semiconductor layer 10, thus leaving only the recess fillings 11 shown in FIG. 5. This is an idealized drawing; remaining parts of the semiconductor layer 10 may also cover the sidewalls of the memory layer sequence within the openings 6. After a subsequent oxidation step and the application of the gate electrode 9 material, a product according to the cross-section of FIG. 3 is obtained. The difference is that the recesses 7 are not filled with the bitline oxide originating from the semiconductor material of the substrate 1, but that also the additionally deposited material of the recess filling 11 is oxidized. This method involves an additional deposition and etching step, but the structure of the resulting product may be better controlled than in the variant of the method that was described first.

Figure 6:
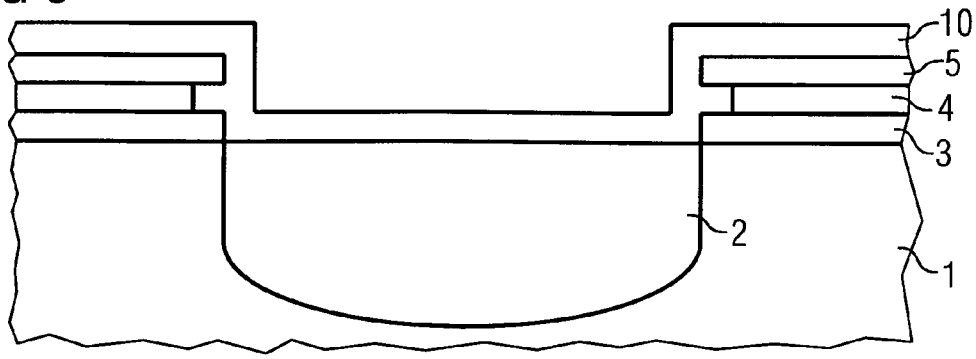
FIG. 6 shows a cross-section according to FIG. 4 for an alternative embodiment.

The etching of the recesses 7 is not necessary if a layer of semiconductor material is deposited. It may also be advantageous to etch recesses with a smaller depth than is necessary in the previously described embodiments. FIG. 6 shows a cross-section according to FIG. 4 for the case of an embodiment with small recesses, having only a small lateral depth, after the deposition of a semiconductor layer 10. This deposition is performed conformally so that the layer is formed with essentially uniform thickness. The semiconductor layer 10 is then etched back anisotropically so that it is removed from the upper surface of the top confinement layer 5 and from the surface of the buried bitlines and source/drain regions 2.

Figure 7:
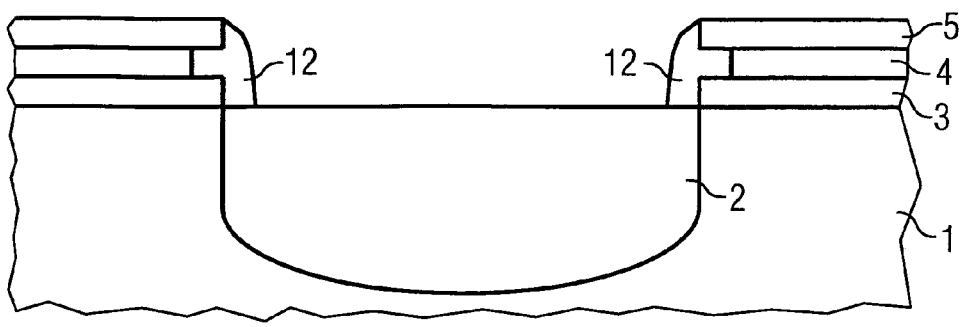
FIG. 7 shows the cross-section according to FIG. 6 after the formation of sidewall spacers.

FIG. 7 shows the result of this etching step, by which sidewall spacers 12 are formed at the sidewalls of the memory layer sequence. The amount of semiconductor material which remains at the indicated locations can be controlled by the depth of the recesses, if recesses are provided at all, and the thickness of the deposited semiconductor layer 10. The subsequent oxidation step then produces the structure of the device according to the cross-section of FIG. 3, including the formation of gate electrodes and wordlines. The spacer formation requires an anisotropic etching process, whereas the recess fillings 11 can also be obtained by an isotropic etching step. The etching steps are performed in the usual way, selectively with respect to the material of the memory layer sequence.

By this method, the edge of the memory layer 4 is optimized in order to improve the charge storage even at high temperatures and under the condition of gate stress. This will improve the device reliability. It will especially avoid a drift in the performance parameters of reference cells during high temperature operating lifetime. The method is especially advantageous because the deposition of an additional oxide layer is avoided so that there are no additional thickness variations caused by a deposited oxide. The improved edge confinement of the memory layer is exclusively formed by the oxidation of semiconductor material. This is an essential improvement obtained by the inventive method.

Although the present invention and its advantages have been described in detail, it should be understood that various changes, substitutions and alterations can be made herein without departing from the spirit and scope of the invention as defined by the appended claims.

What is claimed is:

1. A method for production of charge-trapping memory devices comprising the steps of:
   providing a semiconductor substrate with a main surface;
   depositing a memory layer sequence comprising a bottom confinement layer, a memory layer, and a top confinement layer;
   providing openings in said memory layer sequence in locations of intended bitlines;
   implanting a dopant to form buried bitlines and source/drain regions that are electrically connected by the bitlines;
   etching said memory layer back selectively with respect to the confinement layers, starting from the openings, to form recesses in the memory layer;
   depositing a layer of semiconductor material that at least fills said recesses;
   selectively removing portions of said semiconductor layers so as to leave said semiconductor material filing said recesses; and
   performing an oxidizing step to form oxide regions above the bitlines and to convert semiconductor material in said recesses to an oxide so as to confine said memory layer sequence with oxide.

2. The method according to claim 1, further comprising depositing said memory layer of silicon nitride and said confinement layers of silicon oxide.

3. The method according to claim 2, further comprising etching said recesses to have a lateral depth which is at least equal to the sum of the thicknesses of the bottom confinement layer and the memory layer.

4. The method according to claim 1, further comprising etching said recesses to have a lateral depth which is at least equal to the sum of the thicknesses of the bottom confinement layer and the memory layer.

5. A method for production of charge-trapping memory devices comprising the steps of:
   providing a semiconductor substrate with a main surface;
   depositing a memory layer sequence comprising a bottom confinement layer, a memory layer, and a top confinement layer;
   providing openings in said memory layer sequence in locations of intended bitlines;
   implanting a dopant to form buried bitlines and source/drain regions that are electrically connected by the bitlines;
   etching said memory layer back selectively with respect to the confinement layers, starting from the openings, to form recesses in the memory layer;
   depositing a semiconductor layer, thereby filling said recesses;
   removing a major portion of said semiconductor layer, leaving at least remaining parts that fill said recesses; and
   performing an oxidizing step to form oxide regions above the bitlines and to convert said remaining parts of said semiconductor layer into oxide.

6. The method according to claim 5, further comprising depositing said memory layer of silicon nitride and said confinement layers of silicon oxide.

7. The method according to claim 6, further comprising etching said recesses to have a lateral depth which is at least equal to the sum of the thicknesses of the bottom confinement layer and the memory layer.

8. The method according to claim 5, further comprising etching said recesses to have a lateral depth which is at least equal to the sum of the thicknesses of the bottom confinement layer and the memory layer.

9. A method for production of charge-trapping memory devices comprising the steps of:
   providing a semiconductor substrate with a main surface;
   depositing a memory layer sequence comprising a bottom confinement layer, a memory layer, and a top confinement layer;
   providing openings in said memory layer sequence in locations of intended bitlines, thereby forming sidewalls to said memory layer sequence;
   implanting a dopant to form buried bitlines and source/drain regions that are electrically connected by the bitlines;
   depositing a semiconductor layer;
   performing an anisotropic etching step to reduce said semiconductor layer to sidewall spacers at said memory layer sequence; and
   performing an oxidizing step to form oxide regions above the bitlines and to convert said sidewall spacers into oxide.

10. The method according to claim 9, further comprising:
    before the deposition of the semiconductor layer, etching said memory layer back selectively with respect to the confinement layers, starting from the openings, to form recesses in the memory layer; and
    filling said recesses with said semiconductor layer.

11. Method according to claim 10, further comprising depositing said memory layer of silicon nitride and said confinement layers of silicon oxide.

12. Method according to claim 9, further comprising depositing said memory layer of silicon nitride and said confinement layers of silicon oxide.

13. A method for production of charge-trapping memory devices comprising the steps of:
- providing a semiconductor substrate with a main surface;
- depositing a memory layer sequence comprising a bottom confinement layer, a memory layer, and a top confinement layer;
- providing openings in said memory layer sequence in locations of intended bitlines, thereby forming sidewalls to said memory layer sequence;
- implanting a dopant to form buried bitlines and source/drain regions that are electrically connected by the bitlines;
- depositing a layer of semiconductor material;
- performing an anisotropic etching step to reduce said layer of semiconductor material to sidewall spacers at said memory layer sequence; and
- performing an oxidizing step to form oxide regions above the bitlines and to convert sidewall spacer semiconductor material into oxide so as to confine said memory layer sequences with oxide.

14. The method according to claim 13, further comprising:
- before the deposition of the semiconductor layer, etching said memory layer back selectively with respect to the confinement layers, starting from the openings, to form recesses in the memory layer; and
- filling said recesses with said semiconductor layer.

15. Method according to claim 14, further comprising depositing said memory layer of silicon nitride and said confinement layers of silicon oxide.

16. Method according to claim 13, further comprising depositing said memory layer of silicon nitride and said confinement layers of silicon oxide.

* * * * *